(12) United States Patent
Lin et al.

(10) Patent No.: US 6,354,680 B1
(45) Date of Patent: Mar. 12, 2002

(54) COMPUTER ENCLOSURE

(75) Inventors: Jonas Lin; Nien-Chiang Liao, both of Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/421,924

(22) Filed: Oct. 20, 1999

(30) Foreign Application Priority Data

Aug. 26, 1999 (TW) ..................................... 88214567 U

(51) Int. Cl.⁷ ............................. A47B 81/00; H05K 5/00
(52) U.S. Cl. ................. 312/223.2; 312/263; 312/265.5; 292/87; 361/724
(58) Field of Search .......................... 312/223.1, 223.2, 312/257.1, 263, 265.5, 265.6, 293.3; 361/683, 684, 685, 724, 725, 726, 722; 292/80, 87, 81; 220/4.02, 4.28, 4.31

(56) References Cited

U.S. PATENT DOCUMENTS

| 5,397,176 A | * | 3/1995 | Allen et al. | 312/223.2 |
| 5,478,126 A | * | 12/1995 | Laesch | 292/DIG. 73 X |
| 5,593,219 A | * | 1/1997 | Ho | 312/263 |
| 5,743,606 A | * | 4/1998 | Scholder | 312/223.2 |
| 5,825,626 A | * | 10/1998 | Hulick et al. | 312/223.2 X |
| 5,839,804 A | * | 11/1998 | Ho | 312/223.2 |
| 5,967,633 A | * | 10/1999 | Jung | 312/223.2 |
| 5,992,955 A | * | 11/1999 | Yang | 312/263 X |
| 5,995,363 A | * | 11/1999 | Wu | 312/223.2 X |
| 6,074,028 A | * | 6/2000 | Ho | 312/223.2 |
| 6,075,693 A | * | 6/2000 | Leman | 292/87 X |

* cited by examiner

Primary Examiner—Peter M. Cuomo
Assistant Examiner—Hanh V. Tran
(74) Attorney, Agent, or Firm—Wei Te Chung

(57) ABSTRACT

A computer enclosure includes a base and a side panel attached to the base. The side panel includes a plastic bezel and a shielding plate attached to the plastic bezel. The plastic bezel forms a latch proximate a rear end thereof which includes a body and a ledge extending from the body proximate the central portion of the body for engaging with an inner surface of the base.

1 Claim, 7 Drawing Sheets

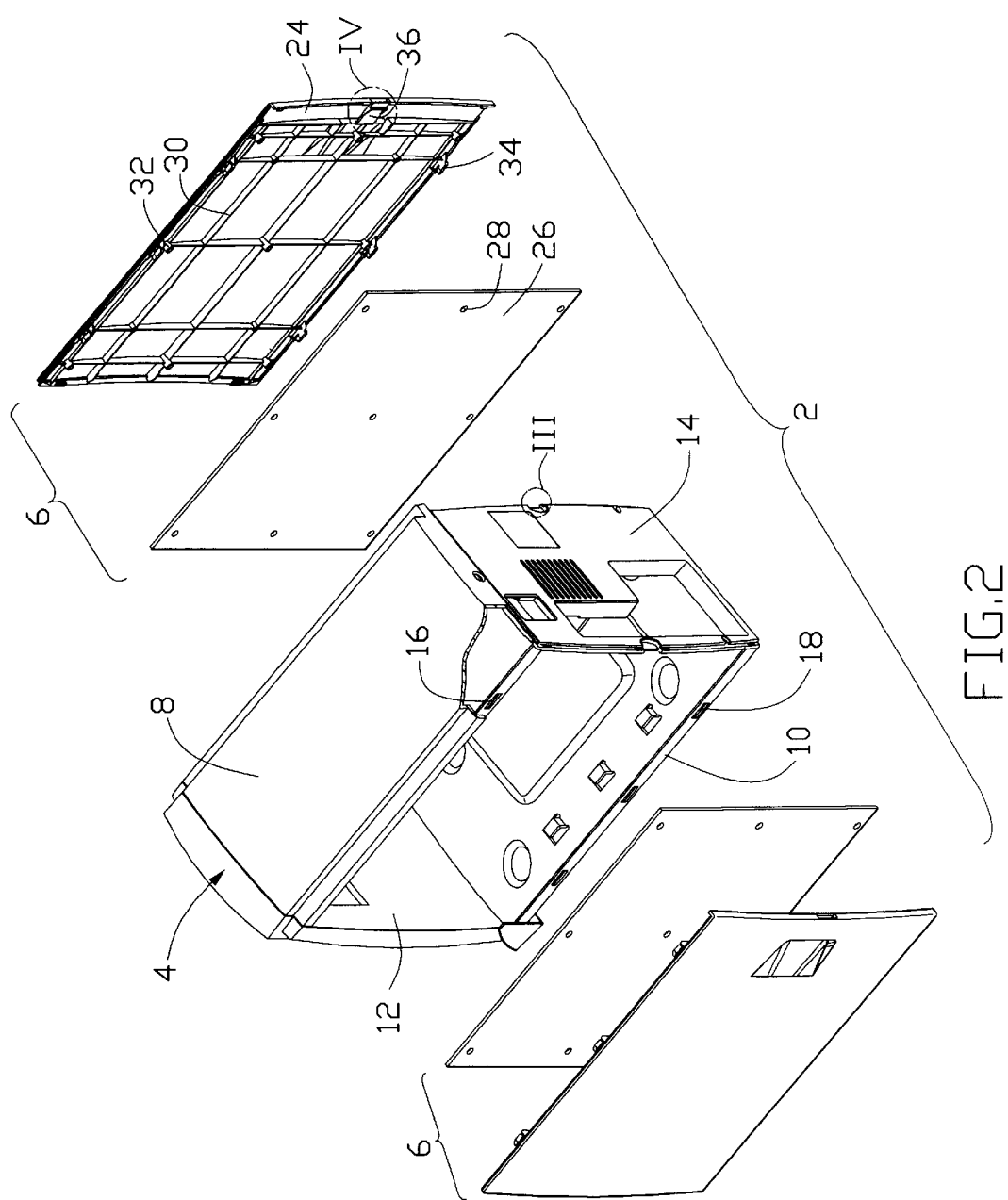

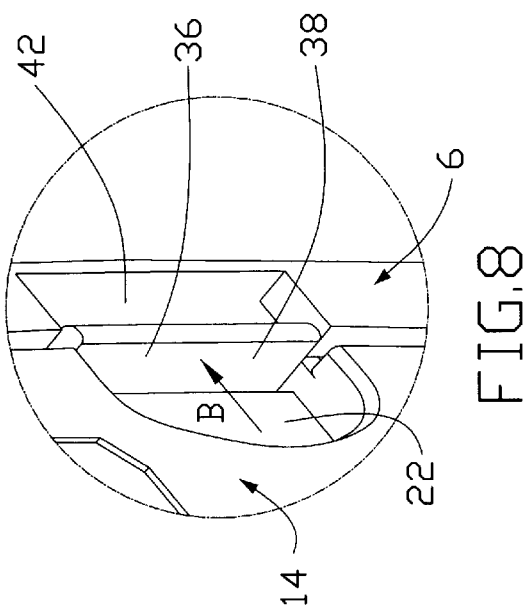
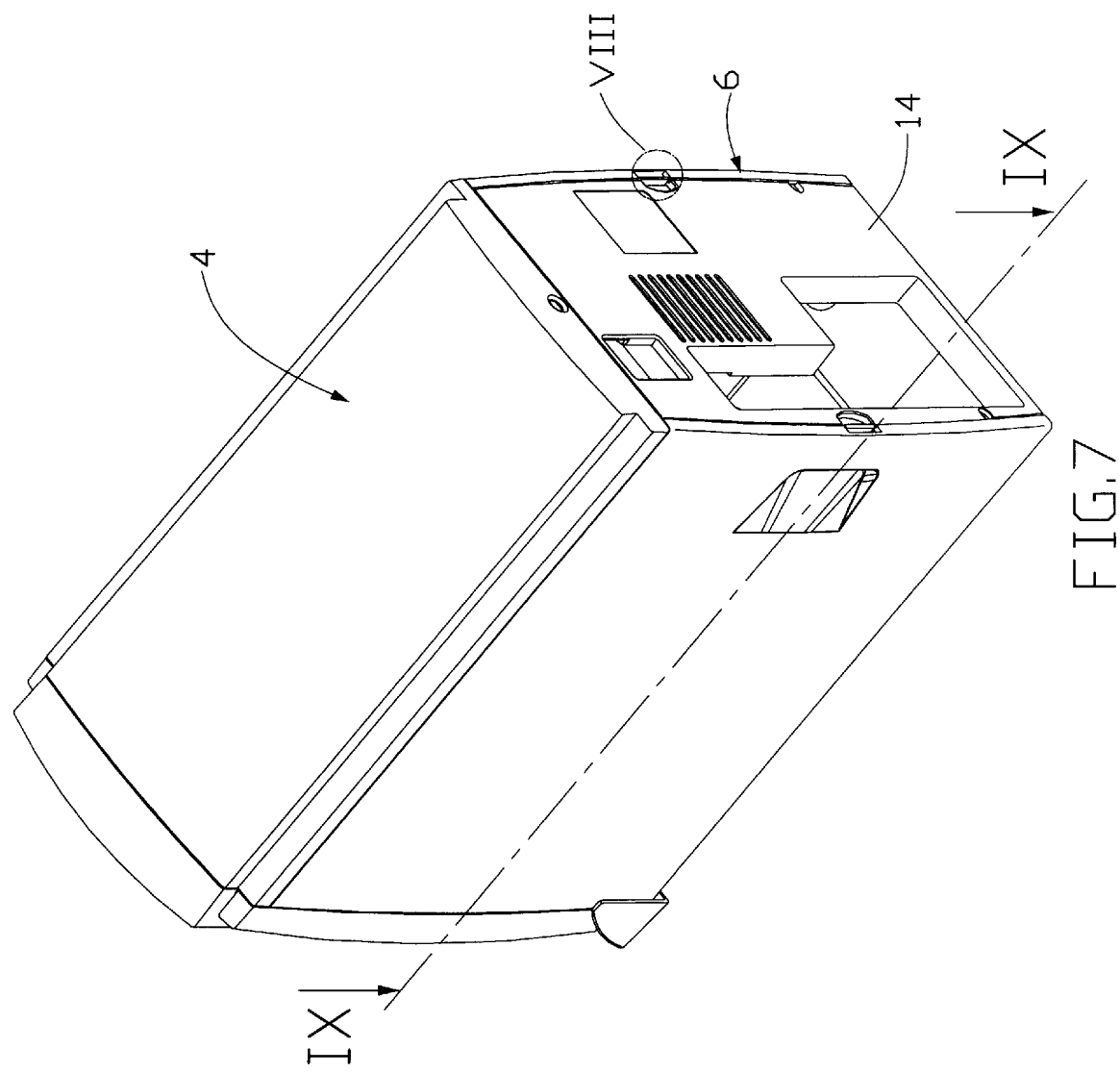

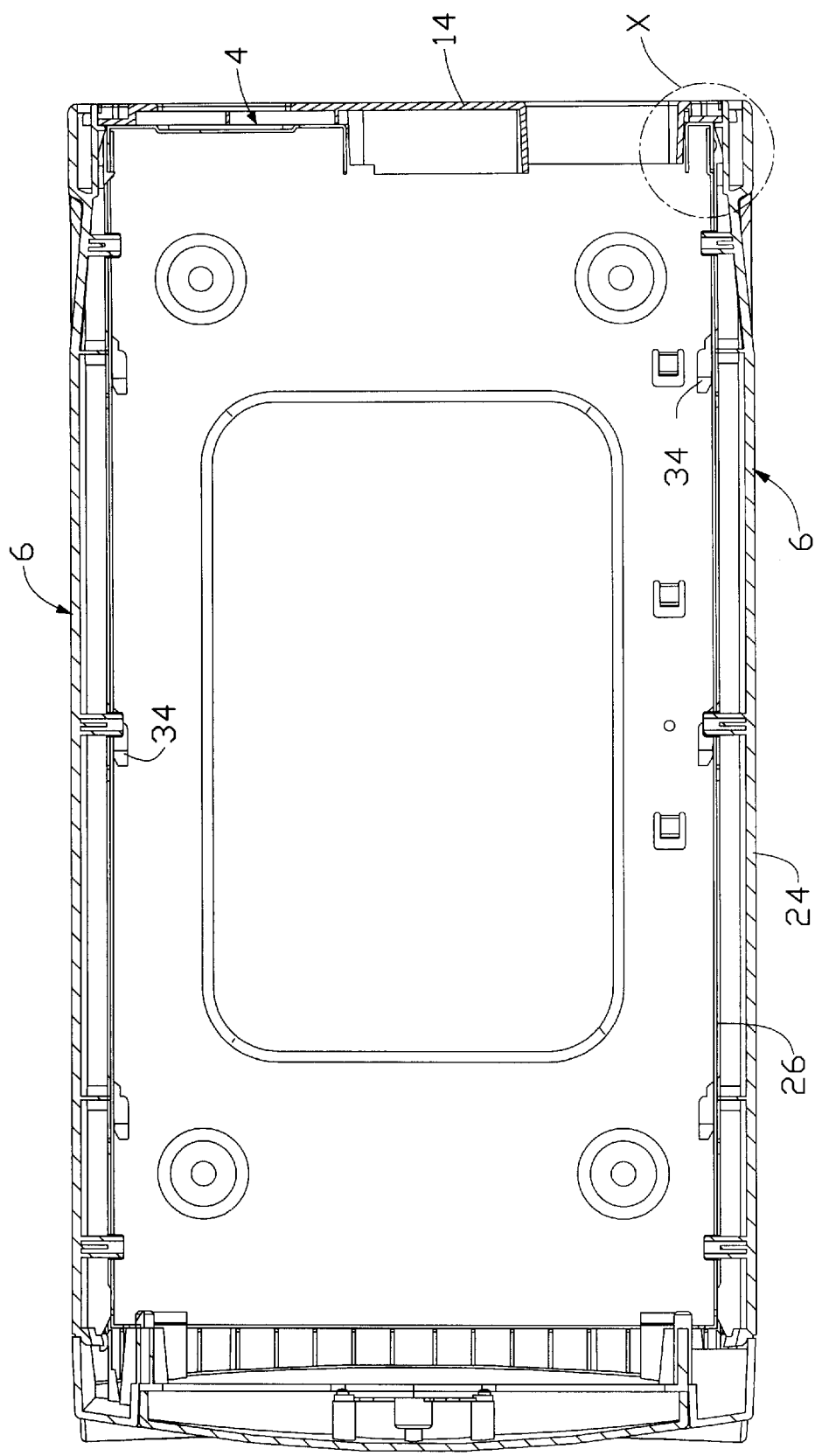

COMPUTER ENCLOSURE

BACKGROUND OF THE INVENTION

1. Field of the invention

The present invention relates to a computer enclosure, and particularly to a computer enclosure including a side panel latchable thereto.

2. The Related Art

A computer includes a computer enclosure for receiving and shielding the electronic devices thereof. A conventional computer enclosure includes a base and a pair of side panels securely attached to the base by bolts, such as those disclosed in Taiwan patent application Nos. 78208843 and 79211922.

Referring to FIG. 1 of the attached drawings, a conventional computer enclosure 100 includes a base 102 and a hood 104 mounted to the base 102. The base 102 has a rear panel 106 which defines two pairs of screw holes 108 in opposite sides of the rear panel 106. The hood 104 includes a pair of parallel side panels 110 and a top panel 112 connecting between the side panels 110. A pair of flanges 114 contiguously extends from opposite rear edges of the side panels 110. Each flange 114 defines a pair of apertures 116 for receiving bolts (not shown) threadedly engaging the screw holes 108 of the base 102 thereby fixing the hood 104 to the base 102. However, to fix the hood 104 to the base 102 by bolts is complicated and time-consuming.

Thus, it is desired to have a computer enclosure which facilitates assembly/disassembly.

SUMMARY OF THE INVENTION

Accordingly, an object of the present invention is to provide a computer enclosure including a side panel having a latch for facilitating assembly/disassembly.

To fulfil the object mentioned above, a computer enclosure in accordance with the present invention comprises a base and a side panel attached to the base. The side panel includes a plastic bezel and a shielding plate attached to the plastic bezel. The plastic bezel forms a latch proximate a rear end thereof for engaging with an inner surface of the base.

Other objects and advantages of the present invention will be understood from the following description of a computer enclosure according to a preferred embodiment of the present invention.

BRIEF DESCRIPTION OF THE DRAWINGS

FIG. 2 is an exploded view of a computer enclosure of the present invention;

FIG. 7 is an assembled view of FIG. 2;

FIG. 8 is an enlarged view of encircled portion VIII of FIG. 7;

FIG. 9 is a cross sectional view taken along plane IX—IX of FIG. 7; and

DETAILED DESCRIPTION OF THE PREFERRED EMBODIMENT

Figure 1:
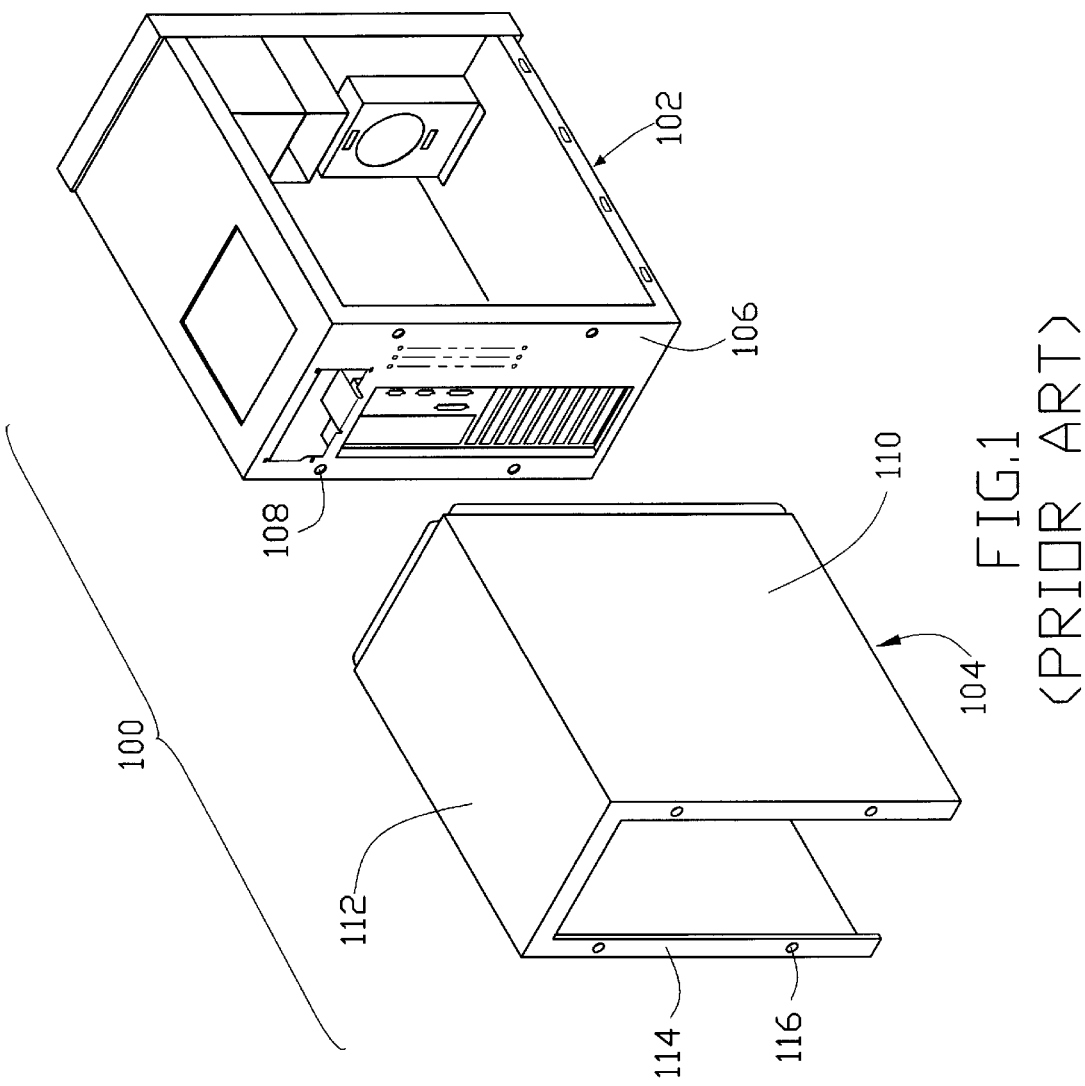
FIG. 1 is an exploded view of a conventional computer enclosure.
Figure 4:
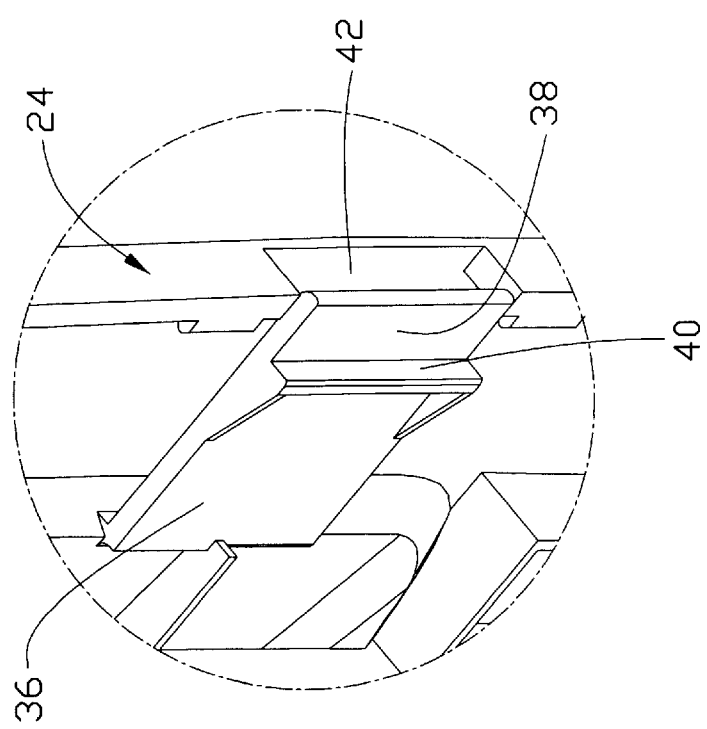
FIG. 4 is an enlarged view of encircled portion IV of FIG. 2.
Figure 3:
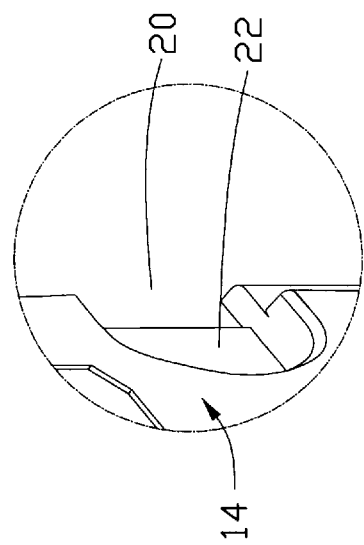
FIG. 3 is an enlarged view of encircled portion III of FIG. 2.
Figure 6:
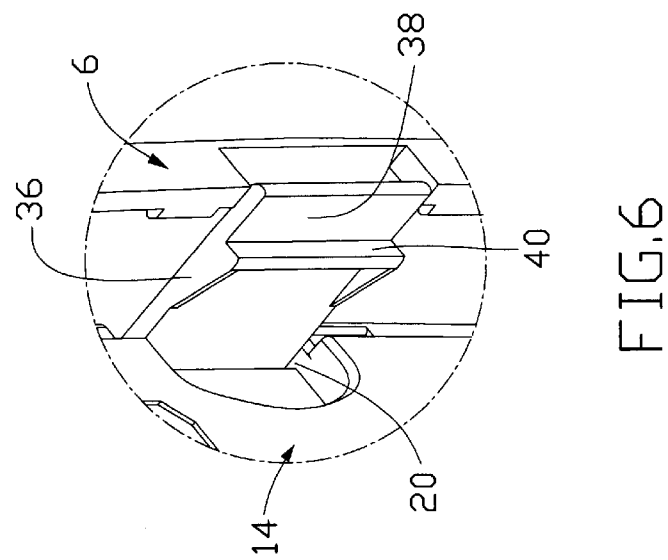
FIG. 6 is an enlarged view of encircled portion VI of FIG. 5.
Figure 5:
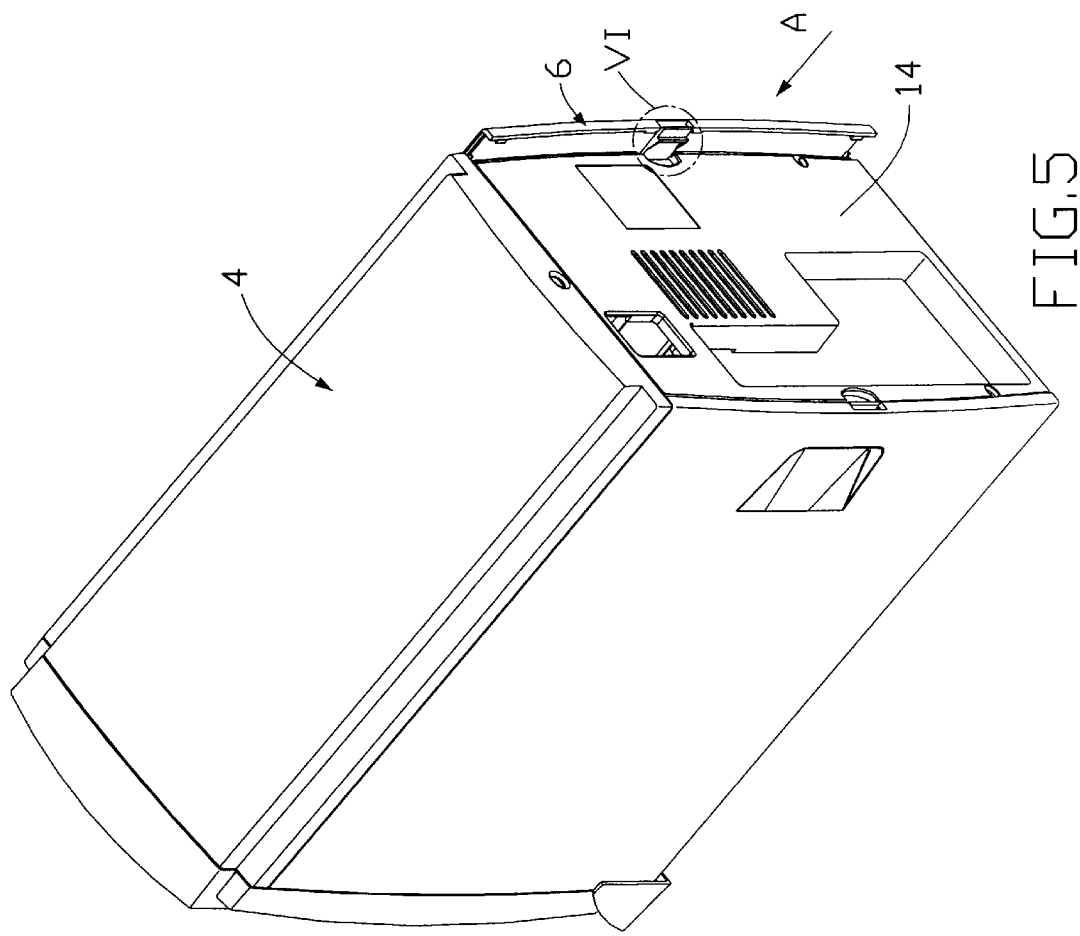
FIG. 5 is a partially assembled view of FIG. 2.

Referring to FIGS. 2–4, a computer enclosure 2 in accordance with the present invention includes a base 4 and a pair of side panels 6 attached to opposite sides of the base 4. The base 4 includes a top panel 8, a bottom panel 10, a front panel 12 and a rear panel 14. Three top and bottom slots 16, 18 are respectively defined in opposite flanges of the top and bottom panels 8, 10. The rear panel 14 defines a pair of cutouts 20 in opposite edges thereof and a pair of recesses 22 in an outer surface thereof in communication with the cutouts 20.

Each side panel 6 includes a plastic bezel 24 and a shielding plate 26 attached to the plastic bezel 24 for shielding. The shielding plate 26 defines a plurality of receiving holes 28 therein. The plastic bezel 24 forms a plurality of intersecting ribs 30 for strengthening the plastic bezel 24. A plurality of protrusions 32 extends from the plastic bezel 24 for engaging with the receiving holes 28 of the shielding plate 26. The plastic bezel 24 forms six hooks 34 respectively adjacent to top and bottom edges thereof for engaging with the top and bottom slots 16, 18 of the base 4. A latch 36 extends from one rib 30 proximate a rear edge of the plastic bezel 24. The latch 36 includes a body 38 with an end connected to the rib 30 and a ledge 40 extending from the body 38 proximate the central portion thereof for engaging with an inner surface of the rear panel 14 of the base 4. A notch 42 is defined in a rear flange of the plastic bezel 24 for providing access to the latch 36.

Referring to FIGS. 5–10, in assembly, the shielding plate 26 is securely attached to the plastic bezel 24 to form the side panel 6. The hooks 34 of the side panel 6 extend into the corresponding top and bottom slots 16, 18 of the base 4 with the body 38 of the latch 36 of the side panel 6 received in the cutout 20 of the rear panel 14. Then the side panel 6 is moved toward the front panel 12 of the base 4 along direction A and the ledge 40 of the latch 36 abuts against the inner surface of the rear panel 14. Thus, the side panel 6 is attached to the base 4.

Figure 10:
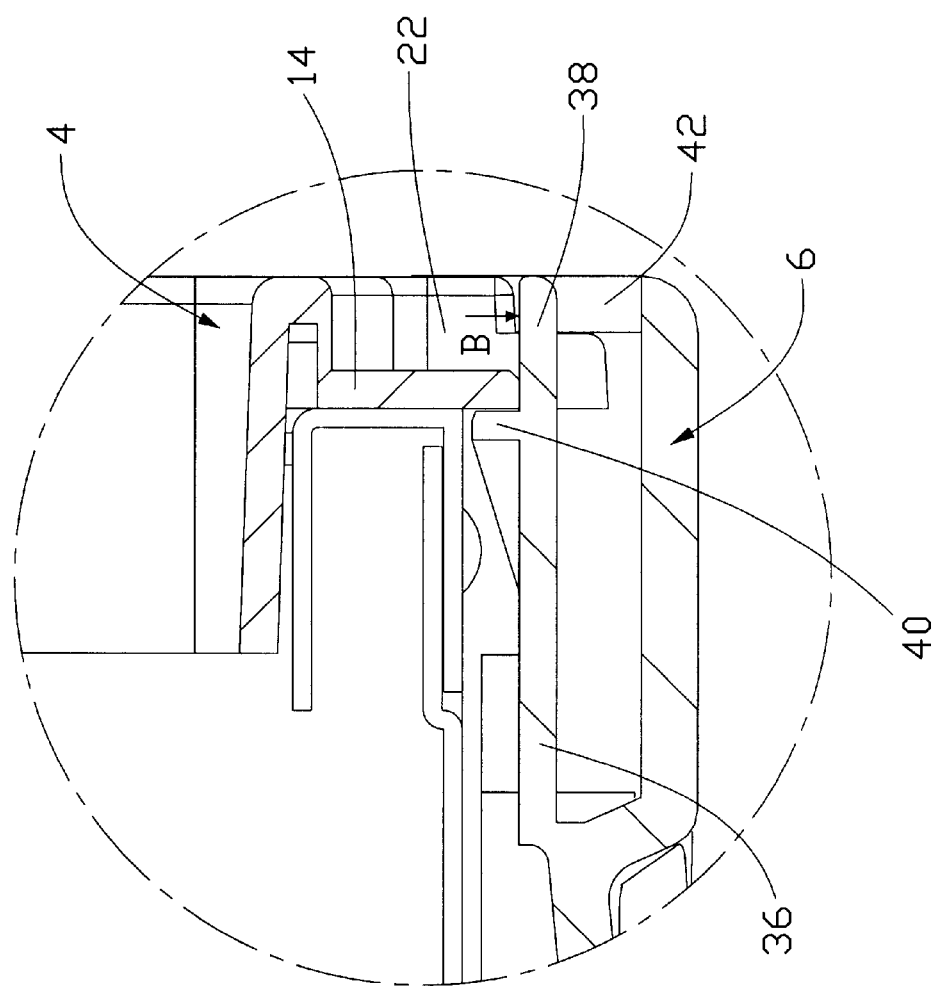
FIG. 10 is an enlarged view of encircled portion X of FIG. 9.

Referring to FIGS. 8 and 10, the body 38 of the latch 36 of the side panel 6 is depressed toward the notch 42 of the side panel 6 along direction B to detach the ledge 40 of the latch 36 from the rear panel 14. Then the side panel 6 is moved along a direction opposite to direction A. Thus, the side panel is detached from the base 4.

It will be understood that the present invention may be embodied in other forms without departing from the spirit thereof. The present example and embodiment, therefore, is to be considered in all respects as illustrative and not restrictive, and the invention is not to be limited to the details given herein.

What is claimed is:

1. A computer enclosure comprising:
    a base defining at least a bottom panel and a rear panel; and
    at least a side panel attached to one side of the base along a rear-to-front direction, said side panel defining at least a hook which cooperates with a corresponding slot in the bottom panel to restrain forward and lateral movements of the side panel with regard to the base, and further defining at least a latch which cooperates with a corresponding cutout formed in the rear panel for releasably latchably attaching the side panel to the rear panel and restraining backward movement of the side panel with regard to the base.

* * * * *